United States Patent
Steffens

(10) Patent No.: US 6,856,642 B2
(45) Date of Patent: Feb. 15, 2005

(54) LASER RESONATOR WITH DIRECTION SENSITIVE DECOUPLING

(75) Inventor: Wolf Michael Steffens, Herrenberg (DE)

(73) Assignee: Agilent Technologies, Inc., Palo Alto, CA (US)

( * ) Notice: Subject to any disclaimer, the term of this patent is extended or adjusted under 35 U.S.C. 154(b) by 106 days.

(21) Appl. No.: 10/139,159

(22) Filed: May 3, 2002

(65) Prior Publication Data
US 2002/0171921 A1 Nov. 21, 2002

(30) Foreign Application Priority Data

| May 15, 2001 | (EP) | ............................................ | 01111721 |
| Apr. 19, 2002 | (EP) | ............................................ | 01121409 |

(51) Int. Cl.[7] ................................................. H01S 3/08
(52) U.S. Cl. ..................................................... 372/108
(58) Field of Search .................................. 372/108, 27

(56) References Cited

U.S. PATENT DOCUMENTS

| 5,048,030 A | * | 9/1991 | Hiiro ........................... 372/68 |
| 5,272,560 A | * | 12/1993 | Baney et al. ................ 359/249 |
| 5,499,132 A | * | 3/1996 | Tojo et al. ................... 359/281 |
| 5,499,134 A | | 3/1996 | Galvanauskas et al. ..... 359/333 |
| 5,511,086 A | | 4/1996 | Su ............................... 372/31 |
| 5,812,567 A | | 9/1998 | Jeon et al. ...................... 372/6 |
| 2002/0172241 A1 | * | 11/2002 | Steffens ........................ 372/27 |

* cited by examiner

Primary Examiner—Nelson Moskowitz
Assistant Examiner—Deandra M. Hughes

(57) ABSTRACT

An optical resonator receives a light beam having a first state of polarization. The resonator comprises a polarization modifying device (40) and a polarization dependent coupling device (30) for coupling light having the first state of polarization into a first path and for coupling light having a state of polarization perpendicular to the first state of polarization into a second path. The polarization dependent coupling device (30) is arranged to receive from a first propagation direction the light beam having the first state of polarization and to couple the light beam from the first propagation direction in the first path to the polarization modifying device (40). The polarization modifying device (40) is arranged for modifying the state of polarization of the light beam before reentering the first path of the polarization dependent coupling device (30) from a second propagation direction in order to couple into the second path a portion of the light beam traveling into the second propagation direction.

12 Claims, 1 Drawing Sheet

LASER RESONATOR WITH DIRECTION SENSITIVE DECOUPLING

BACKGROUND OF THE INVENTION

The present invention relates to coupling out light e.g. from a laser cavity.

Today, most DWDM component test systems for high dynamic range are based on a tunable laser source (TLS) that uses a low source spontaneous emission (SSE) optical output. A laser beam may have an improved signal to noise ratio (SNR), if it is coupled out just behind a wavelength selective device as disclosed e.g. in EP-A-921614. Such output shall be referred to the following as "Low-SSE output".

U.S. Pat. Nos. 5,812,567, 5,499,134, and 5,511,086 (Su) disclose various optical arrangements for decoupling light. In particular, Su provides a polarization dependent beam splitter receiving light beams from different directions and with different and defined states of polarization. While the arrangement of Su requires to already receive adequately polarized light, EP-A-1172906 discloses an optical arrangement for direction dependent coupling out of light, wherein polarization converters are provided for actively converting the states of polarization in order to adjust out-coupling ratios for the light beams propagating in different directions. The teaching of EP-A-1172906 (by the same inventor and the same applicant) is incorporated herein by reference as well as by claiming its priority.

SUMMARY OF THE INVENTION

It is an object of the invention to further improve optical laser systems where light is coupled out. The object is solved by the independent claims. Preferred embodiments are shown by the dependent claims.

A problem of most known beam splitters used as output couplers in a laser cavity arrangement is that not only the desired beam (e.g. the Low-SSE output) from one direction will be coupled out but also a comparable amount of light propagating in the other direction is coupled out on the opposite side of the beam splitter. This 'undesired' output might be utilized or not, but will nevertheless weaken the laser's performance.

The present invention provides a tool allowing to direction sensitive coupling out light from a laser cavity, so that light travelling in different directions with the laser cavity can be coupled out with different coupling ratios.

According to the invention, a laser source comprises a laser medium emitting a first light beam (having a first propagation direction and a first state of polarization) into an external cavity defined by two end points. While the first state of polarization might still be subject to minor variation caused e.g. to thermal variations, power fluctuations or spontaneous emission, it is to be understood that the laser medium is selected to substantially maintain the first state of polarization. Preferably, a semiconductor or optical crystal can be applied as the gain medium.

A direction sensitive coupling out of light is provided by an out-coupling arrangement comprising a polarization dependent coupling device and a polarization converter. In operation, the first light beam (emitted from the laser medium and propagating in the first direction with the first state of polarization) will be launched to the polarization dependent coupling device, such as a polarization dependent beam splitter. The polarization dependent coupling device is provided for coupling out a portion of its incoming light beam, whereby the portion of the coupled out light is defined by the state of polarization of the incoming light beam. The polarization dependent coupling device is adjusted to substantially fully transmit all light having the first state of polarization, while substantially all light having a state of polarization perpendicular to the first state of polarization will be coupled out as a first output beam. Thus, (substantially the full amount of) the first light beam is launched to the polarization converter for converting the first state of polarization to a second state of polarization.

After passing the polarization converter, the first light beam will be reflected by a first one of the two cavity end points and will travel within the cavity as a second light beam having a second propagation direction opposite to the first propagation direction. The first cavity end point is designed in a way that the state of polarization of its incident light beam is substantially maintained, so that the second light beam returning from the first cavity end point substantially has the second state of polarization. This can be achieved e.g. by adjusting the wavelength filter in an appropriate way, by incorporating a wavelength filter independent of the state of polarization, etc.

The second light beam is again launched to the polarization converter for converting the second state of polarization to a third state of polarization. The second light beam with the third state of polarization is then launched to the polarization dependent coupling device coupling out as the first output beam the portion of the second light beam having a state of polarization perpendicular to the first state of polarization. The remaining portion of the second light beam having the first state of polarization is launched towards the second cavity end point and will be fed back to the laser medium.

Thus, it becomes clear that the coupling ratio for the first output beam can be defined by adjusting and/or modifying the third state of polarization with respect to the first state of polarization. However, mismatches between the 'transmitting orientation' of the polarization dependent coupling device and the first state of polarization might lead to an (unwanted) second output beam at the polarization dependent coupling device with opposite propagation direction than the first output beam. In a preferred embodiment, the polarization converter provides a variable polarization state conversion, thus allowing to modify/vary the coupling ratio. With $P_0$ denoting the intensity of the first or second light beam (assuming no losses in the cavity) and $\alpha$ representing the total rotation angle provided by twice passing the polarization converter, the intensity of the first output beam will be $P_{out} = P_0 \sin^2\alpha$, while the intensity of the feedback portion returning to the laser medium will be $P_{FB} = P_0 \cos^2\alpha$. Modifying $\alpha$ thus allows to modifying the coupling ratio of the first output beam.

In a preferred embodiment, wherein the first and second light beams are each linearly polarized, the polarization converter is provided as polarization rotator rotating the first state of polarization by a first rotation angle to the second state of polarization and further rotating the second state of polarization by a second rotation angle to the third state of polarization. The first and second rotation angles are preferably selected to be substantially equal, dependent on the selected directional properties of the polarization converter.

In a preferred embodiment, the polarization dependent coupling device is provided by a polarization dependent beam splitter dividing the incoming light into one portion having one state of polarization and into another portion having 90° difference in the state of polarization.

In a preferred embodiment, the laser source is provided as a wavelength tunable laser further comprising a wavelength dependent filter. The out-coupling arrangement is preferably arranged close to the wavelength dependent filter in a way that a portion of the light returning from the wavelength dependent filter is coupled out with the maximum coupling ratio, while light travelling to the wavelength dependent filter is not coupled out or only with the minimum coupling ratio. Thus, a high purity output beam can be provided without 'wasting' a further and unwanted coupled out beam as in conventional beam splitter arrangements.

The polarization converter can be preferably embodied by a Faraday rotator as known in the art. A retarder (preferably a λ/4 plate) can also be applied for the polarization converter generating a circularly polarized output when receiving linearly polarized light from one direction. In case the retarder receives (from the other direction) also circularly polarized light, however with opposite sense of rotation, the retarder will again convert this to linearly polarized light with 90°-phase shift with respect to the input of the retarder from the one side. In case that a reflecting device (such as a mirror) is applied e.g. for converting the first light beam into the second light beam, the circular polarization will be substantially maintained, however with opposite senses of direction.

It goes without saying that the inventive out-coupling arrangement is not limited to applications wherein the first and third states of polarization of the first and second light beams are (maintained) constant. The inventive out-coupling will work also for varying states of polarization and/or mixtures of linear and circular polarized light, whereby the out-coupling (ratios) might then be subject to such variation or depend on the mixing ratio.

BRIEF DESCRIPTION OF THE DRAWINGS

Other objects and many of the attendant advantages of the present invention will be readily appreciated and become better understood by reference to the following detailed description when considering in connection with the accompanied drawing.

DETAILED DESCRIPTION OF THE INVENTION

Figure 1:
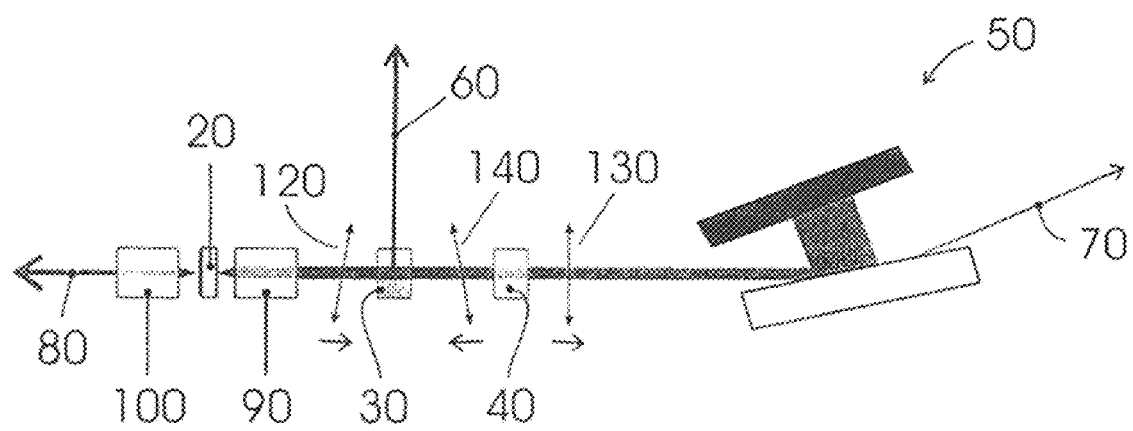
FIG. 1 illustrates in schematic view the present invention applied in an example of a high power and low SSE external cavity laser.

In FIG. 1, a laser chip 20 emanates a light beam having a first state of polarization. A polarizing beam splitter 30 is adjusted in such way that all light with the first state of polarization (from the direction of the laser chip 20) is transmitted, while all light with a state of polarization perpendicular to the first state of polarization will be coupled out. A polarization rotator 40 (preferably a faraday rotator or a λ/4 retarder) rotates the first state of polarization by an angle α/2. After passing a wavelength tunable filter 50, the light again traverses the polarization rotator 40 and will by rotated another time by the angle α/2 to a second state of polarization (differing from the first state of polarization by the angle α).

Now, at the way back, the second state of polarization at the beam splitter 30 is different to the light propagating the other way, so that the polarizing beam splitter 30 couples out (as an output beam 60) the portion of the light (coming in the direction from the wavelength tunable filter 50) having a state of polarization perpendicular to the first state of polarization. Using e.g. a Faraday rotator as the polarization rotator 40 with α=2 α/2=30°, a coupling ratio of 1:4 (with $P_{out}=0.25P_0$ and $P_{FB}=0.75P_0$) can be achieved (see afore-described formulas). Varying the angle α thus allows to modify of vary the coupling ratio for the output beam 60.

The portion of the returning light having the first state of polarization (and thus not being coupled out) is then fed back to the laser chip 20 having the original orientation.

Dependent on the configuration and design of the laser cavity, another output 70 can be derived from the wavelength tunable filter 50 and/or a further output 80 can be derived by providing a partly transparent back facet for the laser chip 20. Collimating lenses 90 and 100 might be provided for collimating light emitted from the laser chip 20.

The states of polarization in the arrangement of FIG. 1 are illustrated for the example of polarized light 120 emitted from the laser chip 20 having a polarization by −15°. The polarizing beam splitter 30 is adjusted that all light with polarization of arrow 120 is transmitted. The polarization rotator 40 rotates the polarization by e.g. 15°(arrow 130) so that the beam travelling to the wavelength tunable filter 50 becomes vertically polarized (0° polarization).

Since the wavelength tunable filter 50 does not (substantially) change the state of polarization, the polarization of the light returning from the wavelength tunable filter 50 to the polarization rotator 40 still has the vertical polarization of arrow 130. The polarization rotator 40 again rotates the polarization by 15° (arrow 140), so that the state of polarization 140 of the light returning from the wavelength tunable filter 50 at the beam splitter 30 now has a state of polarization of +15° and is 30° different with respect to the state of polarization 120 of the light from the laser chip 20. The polarizing beam splitter 30 couples out (as the output beam 60) the portion of the light with the state of polarization perpendicular to the first polarization 120.

In accordance as shown in the embodiment of FIG. 1B in the aforementioned EP-A-1172906, the beam splitter 30 can also be arranged in a way that the output beam 60 is provided by the beam transmitting the beam splitter 30, while the beam reflected by the beam splitter 30 is maintained in the cavity. This illustrates that the term 'opposite directions' should not be understood in its literal meaning but has to be interpreted in a broader sense and with respected to the respective embodiment.

What is claimed is:

1. An optical resonator, comprising:

a polarization dependent coupling device for coupling light having a first state of polarization into a first path, and for coupling light having a state of polarization perpendicular to said first state of polarization into a second path;

a polarization modifying device; and a filter, wherein said polarization dependent coupling device receives, from a first propagation direction, a light beam having said first state of polarization, and couples said light beam to said polarization modifying device, wherein said polarization modifying device modifies a polarization of said light beam, before said light beam reenters said first path from a second propagation direction, in order to couple into said second path a portion of said light beam traveling in said second propagation direction, and wherein said filter is arranged in an optical path of said light beam after passing said polarization dependent coupling device in said first propagation direction and before reentering said polarization dependent coupling device in said second propagation direction.

2. The optical arrangement of claim 1, wherein said polarization modifying device alters said polarization by a rotation angle.

3. The optical arrangement of claim 1, wherein said polarization modifying device comprises a Faraday rotator.

4. The optical arrangement of claim 1, wherein said polarization dependent coupling device comprises a polarization dependent beamsplitter.

5. A laser source comprising:

an optical resonator having:

a polarization dependent coupling device for coupling light having a first state of polarization into a first path, and for coupling light having a state of polarization perpendicular to said first state of polarization into a second path;

a polarization modifying device; and a filter, wherein said polarization dependent coupling device receives, from a first propagation direction, a light beam having said first state of polarization, and couples said light beam to said polarization modifying device, wherein said polarization modifying device modifies a polarization of said light beam, before said light beam reenters said first path from a second propagation direction, in order to couple into said second path a portion of said light beam traveling in said second propagation direction, and wherein said filter is arranged in an optical path of said light beam after passing said polarization dependent coupling device in said first propagation direction and before reentering said polarization dependent coupling device in said second propagation direction; and a laser medium adapted for emitting said light beam, wherein said optical resonator receives said light beam from said laser medium to provide an external resonator for said laser medium.

6. The laser source of claim 5, wherein said filter comprises a wavelength dependent filter.

7. The laser source of claim 6, wherein said optical resonator is arranged close to said wavelength dependent filter, wherein a first portion of said light returning from said wavelength dependent filter is coupled out of said polarization dependent coupling device and a second portion of said light travelling to said wavelength dependent filter is coupled out of said polarization dependent coupling device, and wherein said first portion is significantly greater than said second portion.

8. The laser source of claim 7, wherein said second portion is substantially zero.

9. A method for coupling out a portion of a light beam traveling in an optical resonator, comprising:

receiving, from a first propagation direction, a light beam having a first state of polarization;

coupling said light beam from said first propagation direction in a first path of a polarization dependent coupling device;

coupling said light beam through a filter;

modifying a state of polarization of said light beam;

reentering said light beam with said modified state of polarization in said first path from a second propagation direction; and coupling out, from a second path of said polarization dependent coupling device, a portion of said light beam traveling in said second propagation direction, wherein said portion depends on said modified state of polarization, wherein said filter is arranged in an optical path of said light beam after passing said polarization dependent coupling device in said first propagation direction and before reentering said polarization dependent coupling device in said second propagation direction.

10. The optical resonator of claim 1, wherein said polarization modifying device provides a variable polarization state conversion to vary an out-coupling ratio of said light beam.

11. The laser source of claim 5, wherein said polarization modifying device provides a variable polarization state conversion to vary an out-coupling ratio of said light beam.

12. The method of claim 9, wherein said polarization modifying device provides a variable polarization state conversion to vary said portion.

* * * * *

UNITED STATES PATENT AND TRADEMARK OFFICE
CERTIFICATE OF CORRECTION

PATENT NO. : 6,856,642 B2
DATED : February 15, 2005
INVENTOR(S) : Wolf Michael Steffens It is certified that error appears in the above-identified patent and that said Letters Patent is hereby corrected as shown below:

<u>Title page,</u>
Item [30], Foreign Application Priority Data, should read:
-- May 15, 2001 (EP)        01111721.5
   April 19, 2002 (EP)      02008785.4 --.

Signed and Sealed this

First Day of November, 2005

JON W. DUDAS
*Director of the United States Patent and Trademark Office*